(12) United States Patent
Gans et al.

(10) Patent No.: US 10,481,819 B2
(45) Date of Patent: Nov. 19, 2019

(54) MEMORY DEVICES WITH MULTIPLE SETS OF LATENCIES AND METHODS FOR OPERATING THE SAME

(71) Applicant: Micron Technology, Inc., Boise, ID (US)

(72) Inventors: Dean D. Gans, Nampa, ID (US); Yoshiro Riho, Tokyo (JP); Shunichi Saito, Kanagawa (JP); Osamu Nagashima, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/798,083

(22) Filed: Oct. 30, 2017

(65) Prior Publication Data

US 2019/0129635 A1    May 2, 2019

(51) Int. Cl.
| | |
|---|---|
| *G06F 3/00* | (2006.01) |
| *G06F 3/06* | (2006.01) |
| *G11C 7/10* | (2006.01) |
| *G06F 13/16* | (2006.01) |

(52) U.S. Cl.
CPC .......... *G06F 3/0634* (2013.01); *G06F 3/0604* (2013.01); *G06F 3/0611* (2013.01); *G06F 3/0673* (2013.01); *G06F 13/16* (2013.01); *G11C 7/1045* (2013.01); *G11C 2207/2272* (2013.01)

(58) Field of Classification Search
None
See application file for complete search history.

(56) References Cited

U.S. PATENT DOCUMENTS

| | | | |
|---|---|---|---|
| 6,215,725 B1* | 4/2001 | Komatsu | G11C 5/143 365/226 |
| 2002/0083432 A1* | 6/2002 | Souissi | G06F 8/65 717/178 |
| 2005/0278561 A1* | 12/2005 | Seo | G06F 1/12 713/322 |
| 2007/0136544 A1* | 6/2007 | Oda | G06F 13/4243 711/167 |
| 2010/0094572 A1* | 4/2010 | Chase | G06F 1/3203 702/57 |
| 2015/0120747 A1* | 4/2015 | Jangra | H04L 41/085 707/741 |

* cited by examiner

*Primary Examiner* — David Yi
*Assistant Examiner* — Craig S Goldschmidt
(74) *Attorney, Agent, or Firm* — Perkins Coie LLP

(57) ABSTRACT

Methods, systems, and apparatuses related to memory operation with multiple sets of latencies are disclosed. A memory device or system that includes a memory device may be operable with one or several sets of latencies (e.g., read, write, or write recovery latencies), and the memory device or system may apply a set of latencies depending on which features of the memory device are enabled. For example, control circuitry may be configured to enable one or more features during operations on a memory array, and the control circuitry may apply a set of latency values based on a number or type of features that are enabled. The sets of latency values may depend, for example, on whether various control features (e.g., dynamic voltage frequency scaling) are enabled, and a device may operate within certain frequency ranges irrespective of other characteristics (e.g., mode register values) or latencies applied.

22 Claims, 6 Drawing Sheets

MEMORY DEVICES WITH MULTIPLE SETS OF LATENCIES AND METHODS FOR OPERATING THE SAME

TECHNICAL FIELD

The present disclosure generally relates to memory devices and, more particularly, relates to memory devices with multiple sets of latencies and methods for operating the same.

BACKGROUND

Memory devices are frequently provided in computing systems for the storage of digital information. As memory devices have improved over time, it has become possible to provide additional features that permit more sophisticated operations or to allow the optimization of memory devices to specific use cases. For example, memory devices may provide various operational features such as read link ECC (e.g., in which parity information may be transmitted back to the host on an otherwise unused pin), read data bus inversion (in which data frames with more logic high bits than logic low bits are inverted when sent by a memory device over a data bus to reduce termination energy), byte mode (in which high-speed serial access of sequential address locations is provided), and the like.

While these features have the benefit of providing a memory device with additional functionality or improvements in some performance metrics, they may also incur costs such as additional expense and complexity, or may even cause the memory device to operate more slowly. For example, a memory device that utilizes one or more of the foregoing features may require slower read and/or write latencies than a similar memory device not utilizing those features. It may therefore be beneficial to accommodate various modes of operation to balance benefits and performance impacts of different features.

DETAILED DESCRIPTION

Memory devices can provide additional functionality by way of one or more optional features, some of which may require operating the memory device with greater read and/or write latencies relative to operation with a different feature set. Providing a memory device with a set of read and/or write latencies (e.g., corresponding to different clock speeds, mode registers, etc.) slow enough to permit various feature configurations, however, may provide undesirably slow performance when the features were disabled. It is therefore desirable to provide a way to tailor the latencies with which a memory device is operated for various use cases in which optional features are enabled or disabled.

Accordingly, several embodiments of the present technology are directed to memory devices, systems including memory devices, and methods of operating memory devices in which multiple sets of latencies are provided and may be applied depending on the quantity or type of features enabled. In one embodiment, a memory device comprises a memory array and control circuitry that is configured to enable one or more memory operation features from a set of memory operation features, and to apply, from a plurality of sets of latency values, a set of latency values based at least in part on a number of enabled memory operation features.

Figure 1:
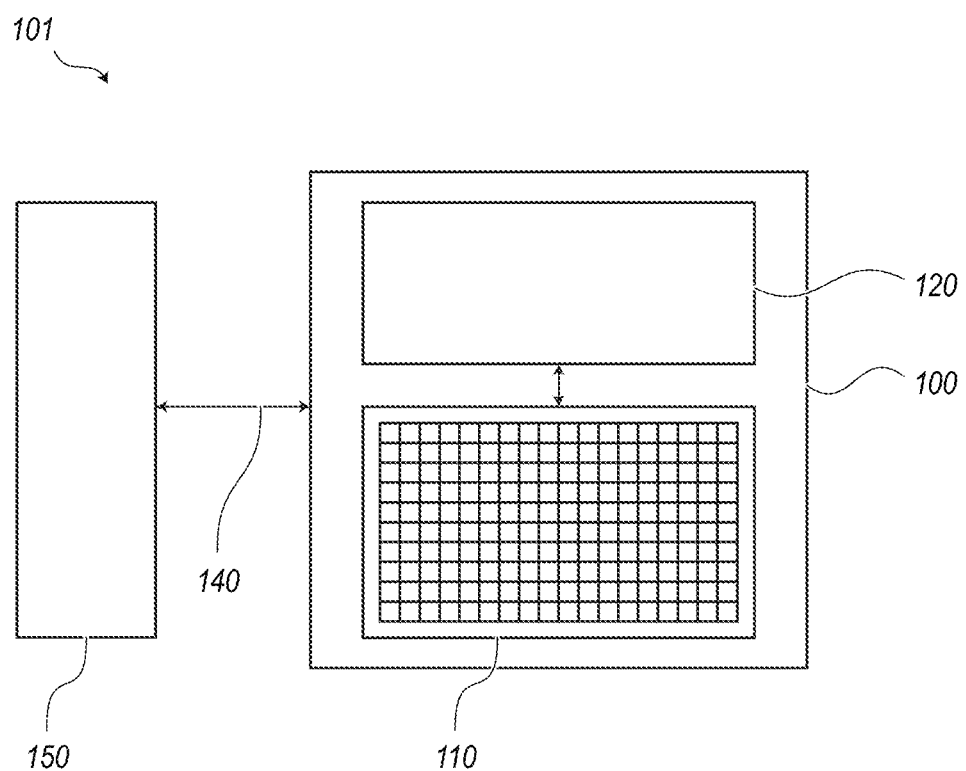
FIG. 1 schematically illustrates a memory system including a memory device in accordance with an embodiment of the present technology.

FIG. 1 schematically illustrates a memory system 101 including a memory device 100 in accordance with an embodiment of the present technology. The memory device 100 includes a memory array 110 and control circuitry 120 operably coupled to the memory array 110. The memory array 110 can include an array of memory cells, including volatile (e.g., DRAM, SRAM, floating body RAM, etc.) and/or non-volatile (NAND, NOR, 3D XPoint™, PCM, MRAM, FeRAM, etc.) cells. The memory array 110 and the control circuitry 120 can be located on a single semiconductor die, or alternatively can be located on separate semiconductor dies (e.g., on a single memory module). The control circuitry 120 is shown schematically in FIG. 1 in a single block, but can also be provided in separate functional blocks, which can be provided on a single semiconductor die or across multiple semiconductor dies.

The memory system 101 further includes a host device 150 coupled to the memory device 100 by a memory bus 140. The memory bus 140 receives command/address signals and data signals from, and transmits data signals to, the host device 150 during memory access operations (e.g., reads and writes). The host device 150 can be any one of a number of electronic devices capable of utilizing memory for the temporary or persistent storage of information, or a component thereof. For example, the host device 150 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 150 may be a networking device (e.g., a switch, a router, etc.) or a recorder of digital images, audio and/or video, a vehicle, an appliance, a toy, or any one of a number of other products. In one embodiment, the host device 150 may be connected directly to the memory device 100, although in other embodiments, the host device 150 may be indirectly connected to the memory device 100 (e.g., over a networked connection or through intermediary devices).

The control circuitry 120 can be configured to provide a number of optional memory operation features. For example, the control circuitry 120 can be configured to provide a read link ECC feature (e.g., in which parity information may be transmitted back to the host on an otherwise unused pin), a read data bus inversion feature (e.g., in which data frames with more logic high bits than logic low bits are inverted when sent by a memory device over a data bus to reduce termination energy), a read data copy feature (e.g., in which data with regular and/or repeating pattern(s) can be transmitted over a reduced number of I/O pins to save energy), a byte mode feature (e.g., in which high-speed serial access of sequential address locations is provided), or any one of a number of other optional features for operating the memory device 100. In one embodiment, one or more of these features, or others, can be enabled in response to a command received from the host device 150 over the memory bus 140. Alternatively, in other embodiments one or more of these features, or others, can be enabled in response to a determination by the memory device (e.g., in response to an externally applied signal voltage, clock signal, or other indicia, or in response to detecting an environmental condition such as temperature, etc.).

The control circuitry 120 can be further configured to apply a set of latency values based upon the number of optional features that are enabled. In one embodiment of the present technology, the control circuitry 120 can maintain a plurality of sets of latencies (e.g., in registers in the control circuitry 120, or in the memory array 110), and select one of the plurality of sets of latencies for utilization during operation of the memory device 100 based upon a determination of the number of currently-enabled optional features. The determination can involve checking the status of register flags indicating the enablement of the features (e.g., in response to a command), checking the status of other external indicia (e.g., applied voltages, clock signals, etc.) and the like.

For example, Table 1 illustrates an embodiment in which the control circuitry 120 is configured to apply one of three sets of read latencies (e.g., one of Set A, Set B or Set C) depending upon the number of optional memory operation features that are enabled in the memory device 100. In Table 1, the sets of read latencies correspond to a configuration in which a Dynamic Voltage Frequency Scaling (DVFS) core of the memory device 100 (e.g., provided as a part of control circuitry 120, or provided as a separate controller) is disabled (e.g., or in which a DVFS core is not provided). The control circuitry 120 can be configured to apply Set A of read latencies when the number of optional memory operation features that are enabled is determined to be zero, to apply Set B of read latencies when the number of optional memory operation features that are enabled is determined to be one, and to apply Set C of read latencies when the number of optional memory operation features that are enabled is determined to be greater than one. In this regard, a memory device in which more than two optional features are provided may be configured to permit no more than two features to be simultaneously enabled (e.g., such that the condition triggering the utilization of Set C can be re-characterized as determining that two optional memory operation features are enabled). Alternatively, a memory device in which more than two optional features are provided may be configured to permit more than two (e.g., all or some number greater than two but less than all) features to be simultaneously enabled.

TABLE 1

| MR2 OP [3:0] | WCK:CK Ratio | Date Rate Range [Mbps] | | CK Frequency Range [MHz] | | Read Latency (RL) | | | nRTP |
|---|---|---|---|---|---|---|---|---|---|
| | | Lower Limit (>) | Upper Limit (≤) | Lower Limit (>) | Upper Limit (≤) | Set A | Set B | Set C | |
| 0000 | 2:1 | 40 | 533 | 10 | 133 | 6 | 6 | 6 | 4 |
| 0001 | 2:1 | 533 | 1067 | 133 | 267 | 8 | 10 | 10 | 4 |
| 0010 | 2:1 | 1067 | 1600 | 267 | 400 | 10 | 12 | 12 | 4 |
| 0011 | 2:1 | 1600 | 2133 | 400 | 533 | 12 | 14 | 16 | 4 |
| 0100 | 2:1 | 2133 | 2750 | 533 | 688 | 16 | 18 | 20 | 6 |
| 0101 | 2:1 | 2750 | 3200 | 688 | 800 | 18 | 20 | 22 | 6 |
| 0000 | 4:1 | 40 | 533 | 5 | 67 | 3 | 3 | 3 | 2 |
| 0001 | 4:1 | 533 | 1067 | 67 | 133 | 4 | 5 | 5 | 2 |
| 0010 | 4:1 | 1067 | 1600 | 133 | 200 | 5 | 6 | 6 | 2 |
| 0011 | 4:1 | 1600 | 2133 | 200 | 267 | 6 | 7 | 8 | 2 |
| 0100 | 4:1 | 2133 | 2750 | 267 | 344 | 8 | 9 | 10 | 3 |
| 0101 | 4:1 | 2750 | 3200 | 344 | 400 | 9 | 10 | 11 | 3 |
| 0110 | 4:1 | 3200 | 3733 | 400 | 467 | 10 | 12 | 13 | 4 |
| 0111 | 4:1 | 3733 | 4267 | 467 | 533 | 12 | 14 | 16 | 4 |
| 1000 | 4:1 | 4267 | 4800 | 533 | 600 | 13 | 15 | 17 | 5 |
| 1001 | 4:1 | 4800 | 5500 | 600 | 688 | 15 | 17 | 19 | 6 |
| 1010 | 4:1 | 5500 | 6000 | 688 | 750 | 16 | 18 | 20 | 6 |
| 1011 | 4:1 | 6000 | 6400 | 750 | 800 | 17 | 19 | 22 | 6 |

Table 2 illustrates another embodiment in which the control circuitry 120 is configured to apply one of three sets of read latencies (e.g., one of Set A, Set B or Set C) depending upon the number of optional memory operation features that are determined to be enabled in the memory device 100. In Table 2, the sets of read latencies correspond to a configuration in which a Dynamic Voltage Frequency Scaling (DVFS) core of the memory device 100 (e.g., provided as a part of control circuitry 120, or provided as a separate controller) is enabled. The control circuitry 120 can be configured to apply Set A of read latencies when the number of optional memory operation features that are enabled is determined to be zero, to apply Set B of read latencies when the number of optional memory operation features that are enabled is determined to be one, and to apply Set C of read latencies when the number of optional memory operation features that are enabled is determined to be greater than one.

TABLE 2

| MR2 OP [3:0] | WCK:CK Ratio | Date Rate Range [Mbps] | | CK Frequency Range [MHz] | | Read Latency (RL) | | | |
|---|---|---|---|---|---|---|---|---|---|
| | | Lower Limit (>) | Upper Limit (≤) | Lower Limit (>) | Upper Limit (≤) | Set A | Set B | Set C | nRTP |
| 0000 | 2:1 | 40 | 533 | 10 | 133 | 6 | 6 | 6 | 4 |
| 0001 | 2:1 | 533 | 1067 | 133 | 267 | 10 | 12 | 14 | 4 |
| 0010 | 2:1 | 1067 | 1600 | 267 | 400 | 14 | 16 | 18 | 4 |
| 0011 | 2:1 | 1600 | 2133 | 400 | 533 | 18 | 20 | 22 | 6 |
| 0100 | 2:1 | 2133 | 2750 | 533 | 688 | 22 | 26 | 28 | 8 |
| 0101 | 2:1 | 2750 | 3200 | 688 | 800 | 26 | 30 | 34 | 8 |
| 0000 | 4:1 | 40 | 533 | 5 | 67 | 3 | 3 | 3 | 2 |
| 0001 | 4:1 | 533 | 1067 | 67 | 133 | 5 | 6 | 7 | 2 |
| 0010 | 4:1 | 1067 | 1600 | 133 | 200 | 7 | 8 | 9 | 2 |
| 0011 | 4:1 | 1600 | 2133 | 200 | 267 | 9 | 10 | 11 | 3 |
| 0100 | 4:1 | 2133 | 2750 | 267 | 344 | 11 | 13 | 14 | 4 |
| 0101 | 4:1 | 2750 | 3200 | 344 | 400 | 13 | 15 | 17 | 4 |

In the embodiment of the present example, each of the three sets of read latencies includes a plurality of read latency values expressed in an integer number of clock cycles, where each read latency value corresponds to a mode register (e.g., MR2) and/or clock multiplier (e.g., WCK:CK ratio). In other embodiments, the plurality of read latency values in a set of read latencies can correspond to other factors, such as clock speed, data rates, applied voltages, other registers or commands, environmental conditions (e.g., temperature), and the like.

Although in the foregoing example, the control circuitry 120 has been described as utilizing one of a number of sets of read latencies based on a number of enabled features, in other embodiments, different kinds of latencies can be also be similarly optimized in addition to, or in place of, the read latencies illustrated by way of example in Tables 1 and 2. For example, in another embodiment, the control circuitry 120 can be configured to apply one of a plurality of sets of write latencies depending upon the number of optional memory operation features that are determined to be enabled in the memory device 100, and/or one of a plurality of sets of write recovery times (tWR) depending upon the number of optional memory operation features that are determined to be enabled in the memory device 100. As will be readily understood by one skilled in the relevant art, a memory device in accordance with an embodiment of the present technology can be configured to similarly select one of a plurality of sets of any kind of latency (e.g., any delay indicated by a number of clock cycles) based on a number of optional memory operation features that are determined to be enabled in the memory device.

For example, Table 3 illustrates embodiment in which the control circuitry 120 is configured to apply one of two sets of write latencies (e.g., either Set A or Set B) depending upon the number of optional memory operation features that are determined to be enabled in the memory device 100. In Table 3, the sets of write latencies correspond to a configuration in which a Dynamic Voltage Frequency Scaling (DVFS) core of the memory device 100 (e.g., provided as a part of control circuitry 120, or provided as a separate controller) is disabled (e.g., or in which a DVFS core is not provided). The control circuitry 120 can be configured to apply Set A of write latencies when the number of optional memory operation features that are enabled is determined to be zero, and to apply Set B of read latencies when the number of optional memory operation features that are enabled is greater than zero.

TABLE 3

| MR1 OP [7:4] | WCK:CK Ratio | Date Rate Range [Mbps] | | CK Frequency Range [MHz] | | Write Latency (WL) | |
|---|---|---|---|---|---|---|---|
| | | Lower Limit (>) | Upper Limit (≤) | Lower Limit (>) | Upper Limit (≤) | Set A | Set B |
| 0000 | 2:1 | 40 | 533 | 10 | 133 | 4 | 4 |
| 0001 | 2:1 | 533 | 1067 | 133 | 267 | 4 | 6 |
| 0010 | 2:1 | 1067 | 1600 | 267 | 400 | 6 | 8 |
| 0011 | 2:1 | 1600 | 2133 | 400 | 533 | 8 | 10 |
| 0100 | 2:1 | 2133 | 2750 | 533 | 688 | 8 | 14 |
| 0101 | 2:1 | 2750 | 3200 | 688 | 800 | 10 | 16 |
| 0000 | 4:1 | 40 | 533 | 5 | 67 | 2 | 2 |
| 0001 | 4:1 | 533 | 1067 | 67 | 133 | 2 | 3 |
| 0010 | 4:1 | 1067 | 1600 | 133 | 200 | 3 | 4 |
| 0011 | 4:1 | 1600 | 2133 | 200 | 267 | 4 | 5 |
| 0100 | 4:1 | 2133 | 2750 | 267 | 344 | 4 | 7 |
| 0101 | 4:1 | 2750 | 3200 | 344 | 400 | 5 | 8 |
| 0110 | 4:1 | 3200 | 3733 | 400 | 467 | 6 | 9 |
| 0111 | 4:1 | 3733 | 4267 | 467 | 533 | 6 | 11 |
| 1000 | 4:1 | 4267 | 4800 | 533 | 600 | 7 | 12 |
| 1001 | 4:1 | 4800 | 5500 | 600 | 688 | 8 | 13 |
| 1010 | 4:1 | 5500 | 6000 | 688 | 750 | 9 | 14 |
| 1011 | 4:1 | 6000 | 6400 | 750 | 800 | 9 | 16 |

In the embodiment of the present example, each of the two sets of write latencies includes a plurality of write latency values expressed in an integer number of clock cycles, where each write latency value corresponds to a mode register (e.g., MR1) and/or clock multiplier (e.g., WCK:CK ratio). In other embodiments, the plurality of write latency values in a set of write latencies can correspond to other factors, such as clock speed, data rates, applied voltages, other registers or commands, environmental conditions (e.g., temperature), and the like.

Although in the foregoing examples of Tables 1 through 3, embodiments applying one of either two or three sets of latencies are illustrated, in other embodiments of the present technology, a memory device can include more or than two or three sets of latencies to be applied depending upon a number of enabled features (e.g., four sets of latencies, five sets, eight sets, ten sets, sixteen sets, etc.). Moreover, although in the foregoing examples the selection of the set of latencies to be used has been described as dependent upon a number of optional features that are enabled (e.g., enabled by the control circuitry, or determined by the control circuitry to have been enabled by, e.g., another portion of the memory device or by a connected host, processor, or other external device), in other embodiments the selection of the set of latencies to be used can depend upon other factors (e.g., user-selectable by pin signal, command protocol, mode register settings or the like, determined by operating parameter such as clock speed, supplied voltage, and/or environmental factors such as temperature, etc.).

Furthermore, although in the foregoing examples of Tables 1 and 2, the sets of latencies configured for use with a greater number of enabled optional memory operation features have latencies that are equal to or greater than a corresponding latency in a set for use with a smaller number of such features, in other embodiments a set of latencies may have some latencies that are less than a corresponding latency in a set for use with a smaller number of enabled memory operation features. For example, some memory operation features may provide a speed advantage, such that enabling the feature permits smaller latency values, for at least some mode register settings and/or clock ratios.

In another embodiment, rather than storing pre-determined sets of read latencies (e.g., in registers in control circuitry 120, or in the memory array 110, or in another location in the memory device 100), the control circuitry 120 can be configured to calculate the read latency values for a set of read latencies to be used based upon a determined number of enabled optional memory operation features. In this regard, control circuitry 120 can be configured with an algorithm that calculates from the number of currently-enabled optional memory operation features and various other inputs such as mode register settings, clock multipliers, and the like, a latency (e.g., a read latency, a write latency, and/or other latencies) or a set of latencies similar to those set forth above for utilization by the memory device 100.

Figure 2:
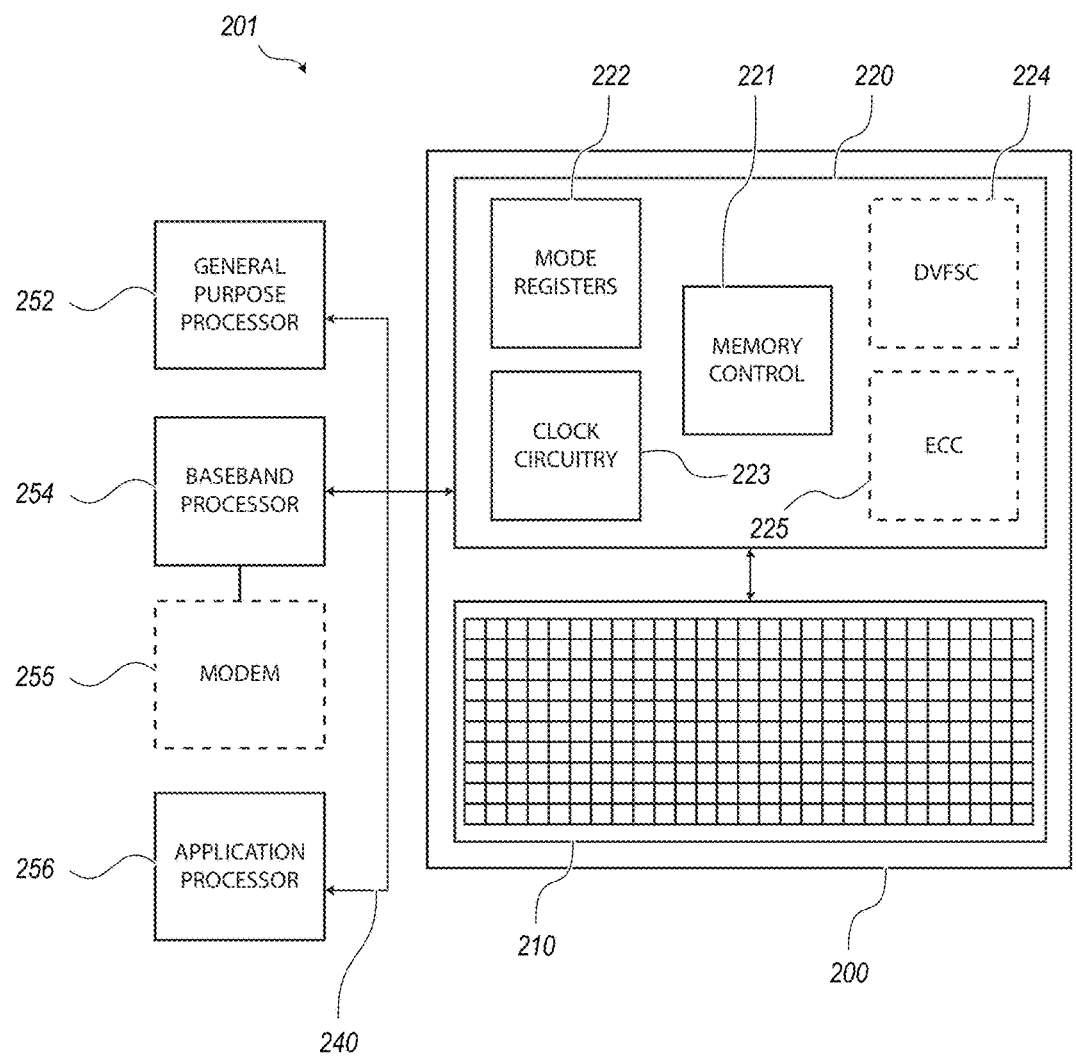
FIG. 2 schematically illustrates a memory system including a memory device in accordance with an embodiment of the present technology.

FIG. 2 schematically illustrates a memory system 201 including a memory device 200 in accordance with an embodiment of the present technology. The memory device 200 includes a memory array 210 and control circuitry 220 operably coupled to the memory array 210. The memory array 210 can include an array of memory cells, including volatile (e.g., DRAM, SRAM, floating body RAM, etc.) and/or non-volatile (NAND, NOR, 3D XPoint™, PCM, MRAM, FeRAM, etc.) cells. The memory array 210 and the control circuitry 220 can be located on a single semiconductor die, or alternatively can be located on separate semiconductor dies (e.g., on a single memory module). The control circuitry 220 is shown schematically in FIG. 2 in a single block, but can also be provided in separate functional blocks, which can be provided on a single semiconductor die or across multiple semiconductor dies.

The memory system 201 further includes one or more processors, such as general purpose processor 252, baseband processor 254, and application processor 256, which are coupled to the memory device 200 by a memory bus 240. The memory bus 240 receives command/address signals and data signals from, and transmits data signals to one or more of the processors during memory access operations (e.g., reads and writes). Baseband processor 254 may be further coupled to a model 255 (e.g., employing cellular, WiFi®, Bluetooth®, near field, or some other technology or protocol for communicating wirelessly with another device). In one embodiment, the one or more processors may be connected directly to the memory device 200, although in other embodiments, one or more of the processors may be indirectly connected to the memory device 200 (e.g., over a networked connection or through intermediary devices).

The control circuitry 220 can include a number of functional components, including a memory control component 221 (e.g., providing command and/or address decoding, input/output functions, amplification circuitry, power supply and control, etc.), one or more mode registers 222 (e.g., for the temporary or permanent storage of information for use by the control circuitry 220 or the memory device 200), and clock circuitry 223 (e.g., for the synchronization of various components of memory device 200 with one or more external clock signals such as CK, !CK, WCK, !WCK that may be provided over the memory bus 240, and/or for the internal generation of clock signals). The control circuitry 220 may further include a Dynamic Voltage Frequency Scaling Core (DVFSC) 224 and an error-correcting coder (ECC) component 225.

The control circuitry 220 can be configured to provide a number of optional memory operation features. For example, the control circuitry 220 can be configured to provide a read link ECC feature (e.g., in which parity information may be transmitted back to the host on an otherwise unused pin), a read data bus inversion feature (e.g., in which data frames with more logic high bits than logic low bits are inverted when sent by a memory device over a data bus to reduce termination energy), a read data copy feature (e.g., in which data with regular and/or repeating pattern(s) can be transmitted over a reduced number of I/O pins to save energy), a byte mode feature (e.g., in which high-speed serial access of sequential address locations is provided), or any one of a number of other optional features for operating the memory device 200. In one embodiment, one or more of these features, or others, can be enabled in response to a command received from the host device 250 over the memory bus 240. Alternatively, in other embodiments one or more of these features, or others, can be enabled in response to a determination by the memory device (e.g., in response to an externally applied signal voltage, clock signal, or other indicia, or in response to detecting an operating mode, a register setting, an environmental condition such as temperature, etc.).

The control circuitry 220 can be further configured to apply a set of latency values based upon the number of optional features that are enabled. In one embodiment of the present technology, the control circuitry 220 can maintain a plurality of sets of latencies (e.g., in mode registers 222, or in the memory array 210), and select one of the plurality of sets of latencies for utilization during operation of the memory device 200 based upon a determination of the number of currently-enabled optional features. The determination can involve checking the status of register flags indicating the enablement of the features (e.g., in response to a command), checking the status of other external indicia (e.g., applied voltages, clock signals, etc.) and the like.

Figure 3:
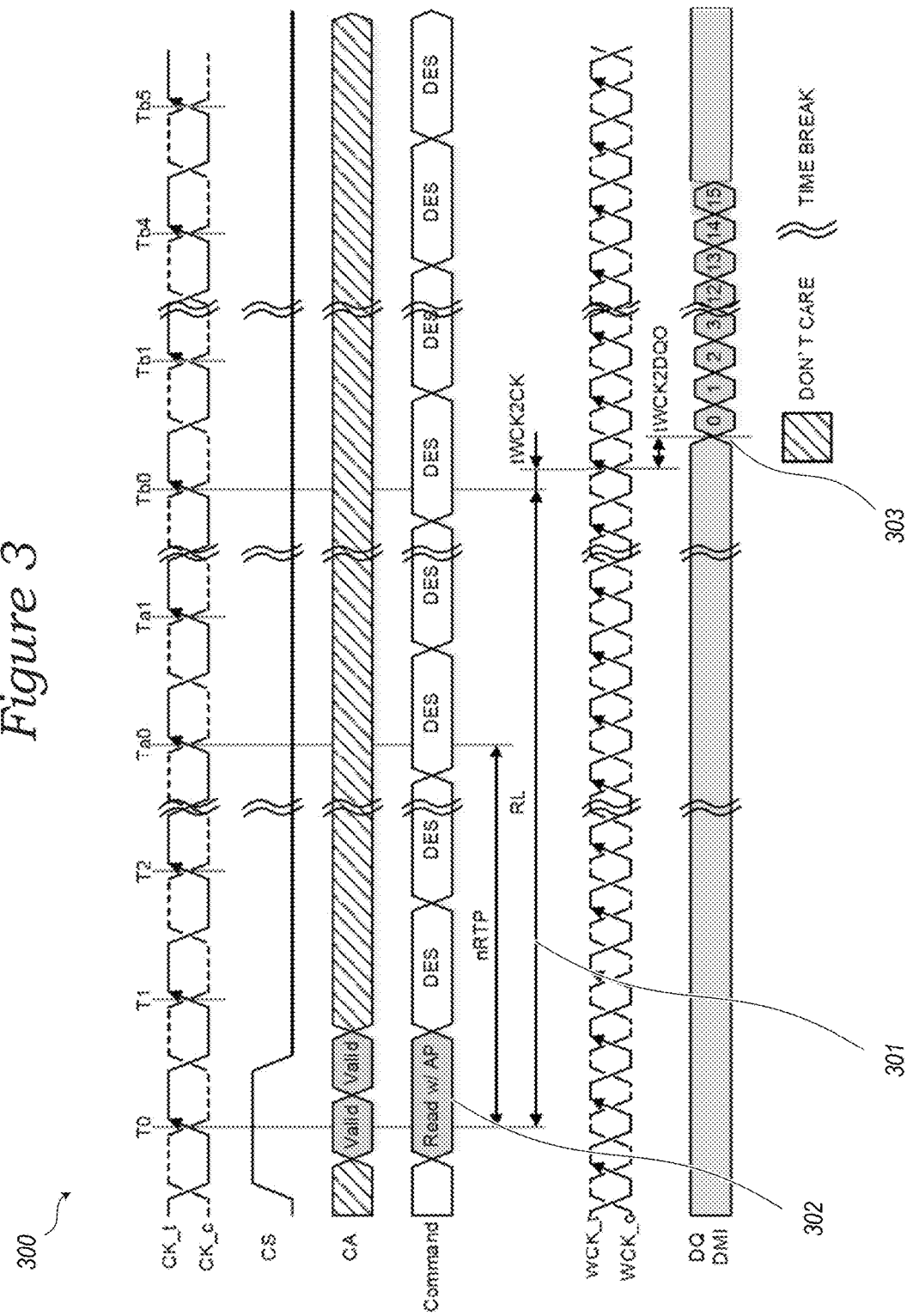
FIG. 3 is a timing diagram illustrating the operation of a memory device in accordance with an embodiment of the present technology.

FIG. 3 is a timing diagram 300 illustrating the operation of a memory device in accordance with an embodiment of the present technology. As can be seen with reference to FIG. 3, the read latency (RL) 301 applied to the memory device from a set of read latencies (based, at least in part, on a number of enabled memory operation features), can correspond to the number of clock cycles that elapse between issuing a read command 302 and the transmission of response data 303 on the data bus. In the example embodiment of FIG. 3, the read latency corresponds to the number of clock cycles between time T0 and time Tb0.

Figure 4:
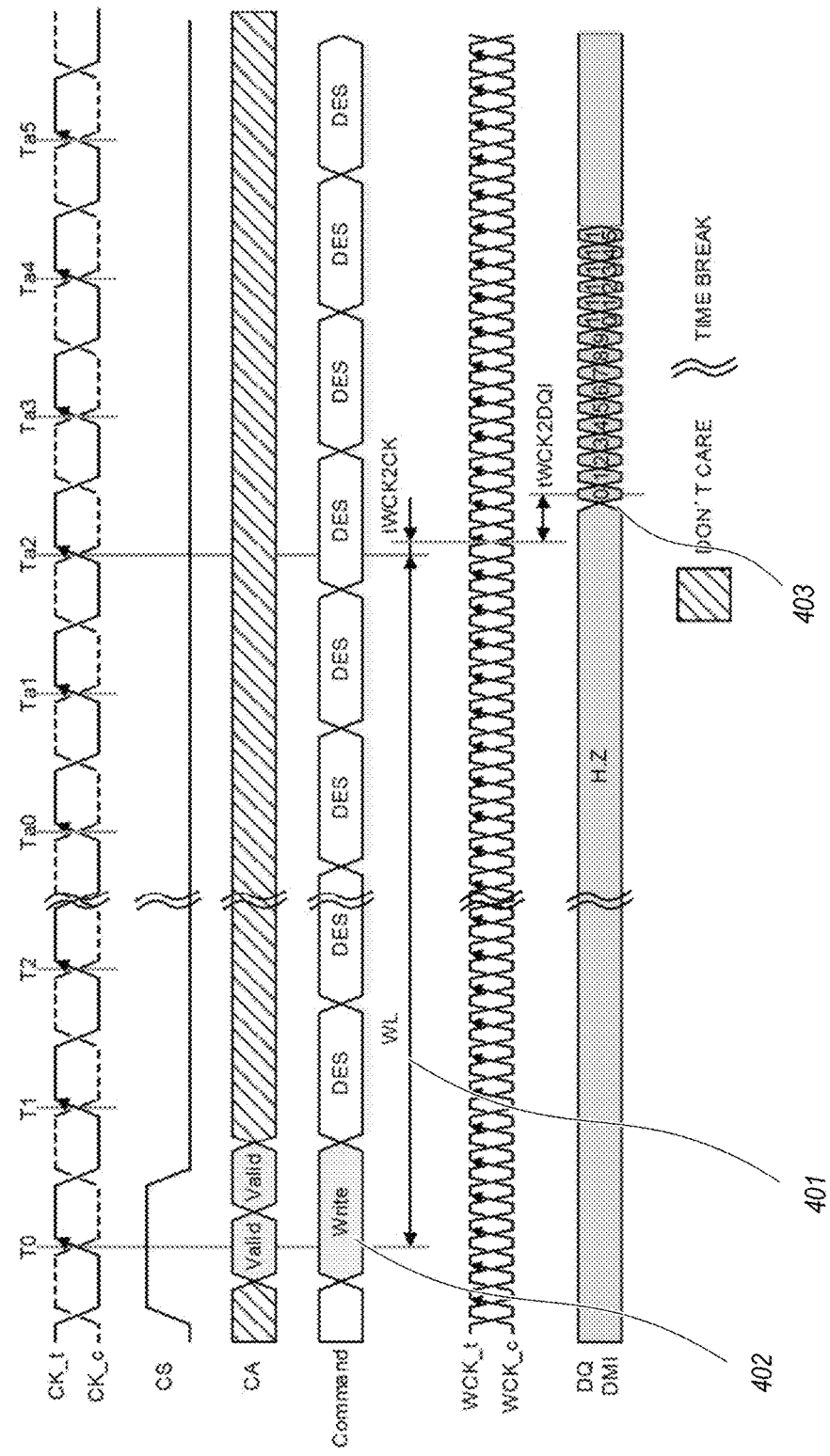
FIG. 4 is a timing diagram illustrating the operation of a memory device in accordance with an embodiment of the present technology.

FIG. 4 is a timing diagram 400 illustrating the operation of a memory device in accordance with an embodiment of the present technology. As can be seen with reference to FIG. 4, the write latency (WL) 401 applied to the memory device from a set of write latencies (based, at least in part, on a number of enabled memory operation features), can correspond to the number of clock cycles that elapse between issuing a write command 402 and the transmission of write data 403 on the data bus. In the example embodiment of FIG. 4, the write latency corresponds to the number of clock cycles between time T0 and time Ta2.

Figure 5:
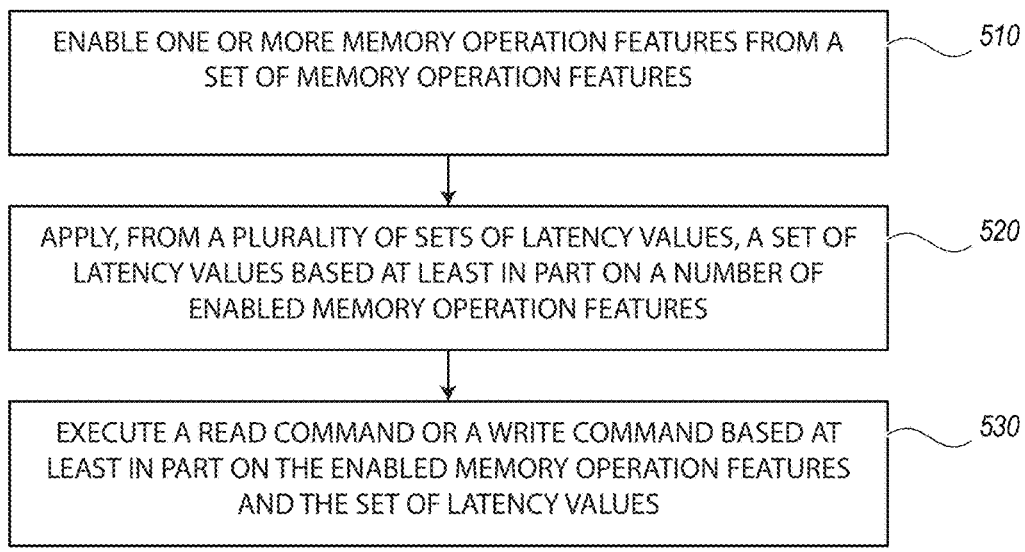
FIG. 5 is a flow chart illustrating a method for operating a memory device in accordance with an embodiment of the present technology.

FIG. 5 is a flow chart illustrating a method of operating a memory device in accordance with an embodiment of the present technology. The method includes enabling one or more memory operation features from a set of memory operation features (box 510). In accordance with one aspect, the at least one selectable memory operation feature can comprise one or more of a byte mode feature, a read data bus inversion feature, and read data copy feature, and a read link error correction feature (e.g., provided by an ECC component such as ECC component 225). The enabling feature (box 510) may be implemented with control circuitry 120, as illustrated in FIG. 1 in greater detail, above. The method further includes applying, from a plurality of sets of latency values, a set of latency values based at least in part on a number of enabled memory operation features (box 520). Each of the plurality of sets of latency values can include a plurality of latency values corresponding to a plurality of mode register settings (e.g., stored in a mode register such as mode register 222) and/or to a plurality of clock ratios (e.g., determined by a clock circuitry component such as clock circuitry component 223). The plurality of sets of latency values can comprise a plurality of sets of read latency values, of write latency values, and/or of write recovery times. The applying feature (box 520) may be implemented with control circuitry 120, as illustrated in FIG. 1 in greater detail, above. The method further includes executing (e.g., with control circuitry 120 of FIG. 1, above, or with memory control component 221 of FIG. 2, above) a read command or a write command for one or more cells of the memory device based at least in part on the enabled memory operation features and the set of latency values (box 530).

The method can further include determining whether dynamic voltage frequency scaling (e.g., DVFSC 224) is disabled or enabled, such that the plurality of sets of latency values can be based at least in part on whether DVFSC 224 is disabled or enabled. Moreover, the method can further include identifying a lower limit for a clock signal and an upper limit for the clock signal, and determining a setting for a mode register from a plurality of mode registers (e.g., mode registers 222) of the memory device (e.g., wherein the setting for the mode register comprises a four-bit value). In such an embodiment, the method can include operating the memory device at a frequency that is not less than the lower limit for the clock signal nor greater than the upper limit for the clock signal irrespective of the setting for the mode register.

Figure 6:
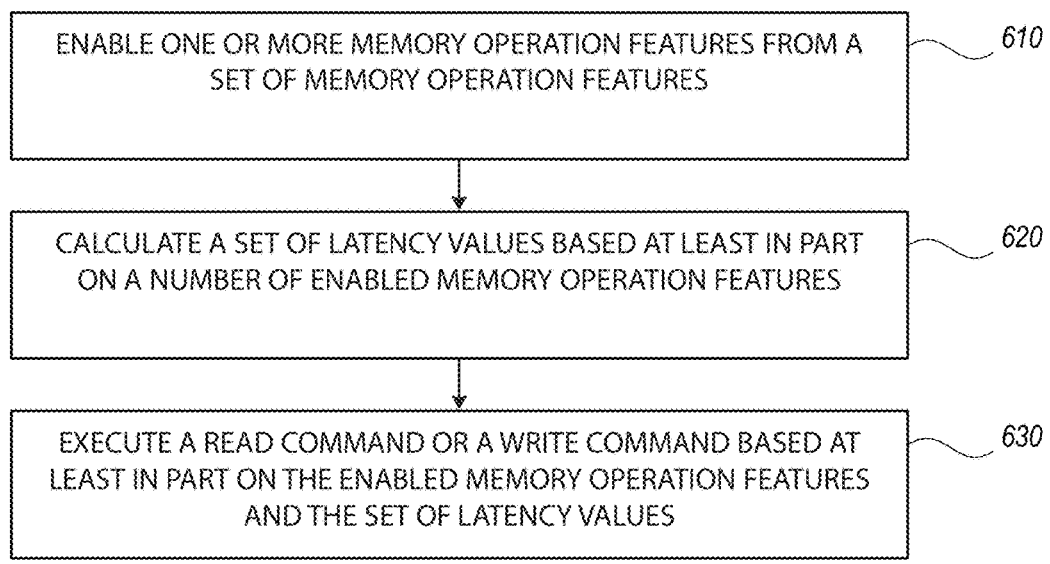
FIG. 6 is a flow chart illustrating a method for operating a memory device in accordance with an embodiment of the present technology.

FIG. 6 is a flow chart illustrating a method of operating a memory device in accordance with an embodiment of the present technology. The method includes enabling one or more memory operation features from a set of memory operation features (box 610). In accordance with one aspect, the at least one selectable memory operation feature can comprise one or more of a byte mode feature, a read data bus inversion feature, and read data copy feature, and a read link error correction feature (e.g., provided by an ECC component such as ECC component 225). The enabling feature (box 610) may be implemented with control circuitry 120, as illustrated in FIG. 1 in greater detail, above. The method further includes calculating a set of latency values based at least in part on a number of selected memory operation features (box 620). Each of the plurality of sets of latency values can include a plurality of latency values corresponding to a plurality of mode register settings (e.g., stored in a mode register such as mode register 222) and/or to a plurality of clock ratios (e.g., determined by a clock circuitry component such as clock circuitry component 223). The plurality of sets of latency values can comprise a plurality of sets of read latency values, of write latency values, and/or of write recovery times. The calculating feature (box 620) may be implemented with control circuitry 120, as illustrated in FIG. 1 in greater detail, above. The method further includes executing (e.g., with control circuitry 120 of FIG. 1, above, or with memory control component 221 of FIG. 2, above) a read command or a write command for one or more cells of the memory device based at least in part on the enabled memory operation features and the set of latency values (box 630).

The method can further include determining whether dynamic voltage frequency scaling control (e.g., DVFSC 224) is disabled or enabled, such that the plurality of sets of latency values can be based at least in part on whether DVFSC 224 is disabled or enabled. Moreover, the method can further include identifying a lower limit for a clock signal and an upper limit for the clock signal, and determining a setting for a mode register from a plurality of mode registers (e.g., mode registers 222) of the memory device (e.g., wherein the setting for the mode register comprises a four-bit value). In such an embodiment, the method can include operating the memory device at a frequency that is not less than the lower limit for the clock signal nor greater than the upper limit for the clock signal irrespective of the setting for the mode register.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of operating a memory device, comprising:
enabling one or more memory operation features from a set of memory operation features;
applying, from a plurality of sets of latency values, a set of latency values based at least in part on a number of enabled memory operation features; and
executing a read command or a write command for one or more cells of the memory device based at least in part on the enabled memory operation features and the set of latency values,
wherein the one or more memory operation features comprises three features,
wherein the plurality of sets of latency values comprises three sets of latency values, and
wherein the method comprises applying a first one of the three sets of latency values when none of the three features is enabled, applying a second one of the three sets of latency values when exactly one of the three features is enabled, and applying a third one of the three sets of latency values when exactly two of the three features is enabled.

2. The method of claim 1, further comprising:
identifying a lower limit for a clock signal and an upper limit for the clock signal;
determining a setting for a mode register from a plurality of mode registers of the memory device, wherein the setting for the mode register comprises a four-bit value; and
operating the memory device at a frequency that is not less than the lower limit for the clock signal nor greater than the upper limit for the clock signal irrespective of the setting for the mode register.

3. The method of claim 1, further comprising:
determining whether dynamic voltage and frequency scaling (DVFS) is disabled or enabled, wherein the plurality of sets of latency values is based at least in part on whether DVFS is disabled or enabled.

4. The method of claim 1, wherein the one or more memory operation features comprises at least one of a byte mode feature, a read data bus inversion feature, a read data copy feature, a read link error correction feature, or any combination thereof.

5. The method of claim 1, wherein each set of latency values of the plurality of sets of latency values includes a plurality of latency values that each correspond to a mode register setting from a plurality of mode register settings of the memory device.

6. The method of claim 1, wherein each set of latency values of the plurality of sets of latency values includes a plurality of latency values that each correspond to a clock ratio from a plurality of clock ratios of the memory device.

7. The method of claim 1, wherein the plurality of sets of latency values comprises a plurality of sets of read latency values.

8. The method of claim 1, wherein the plurality of sets of latency values comprises a plurality of sets of write latency values.

9. The method of claim 1, wherein the plurality of sets of latency values comprises a plurality of sets of write recovery times.

10. A memory device, comprising:
a memory array; and
control circuitry configured to:
enable one or more memory operation features from a set of memory operation features; and
apply, from a plurality of sets of latency values, a set of latency values based at least in part on a number of enabled memory operation features,
wherein the one or more selectable features comprises three selectable features,
wherein the plurality of sets of latency values comprises three sets of latency values, and
wherein the control circuitry is configured to apply a first one of the three sets of latency values when none of the three memory operation features is enabled, to apply a second one of the three sets of latency values when exactly one of the three memory operation features is enabled, and to apply a third one of the three sets of latency values when exactly two of the three sets of latency values are enabled.

11. The memory device of claim 10, wherein the control circuitry is further configured to:
execute a read command or a write command for one or more cells of the memory array based at least in part on the enabled memory operation features and the set of latency values.

12. The memory device of claim 10, wherein the control circuitry is further configured to:
identify a lower limit for a clock signal and an upper limit for the clock signal;
determine a setting for a mode register from a plurality of mode registers of the memory device, wherein the setting for the mode register comprises a four-bit value; and
operate the memory device at a frequency that is not less than the lower limit for the clock signal nor greater than the upper limit for the clock signal irrespective of the setting for the mode register.

13. The memory device of claim 10, wherein the control circuitry is further configured to:
determine whether dynamic voltage and frequency scaling (DVFS) is disabled or enabled, wherein the plurality of sets of latency values is based at least in part on whether DVFS is disabled or enabled.

14. The memory device of claim 10, wherein the memory array and the control circuitry are located on a single semiconductor die.

15. The memory device of claim 10, wherein the memory array and the control circuitry are located on separate semiconductor dies.

16. The memory device of claim 15, wherein the separate semiconductor dies are located on a single memory module.

17. The memory device of claim 10, wherein the one or more memory operation features comprises at least one of a byte mode feature, a read data bus inversion feature, a read data copy feature, a read link error correction feature, or any combination thereof.

18. The memory device of claim 10, wherein each set of latency values of the plurality of sets of latency values includes a plurality of latency values that each correspond to a mode register setting from a plurality of mode register settings of the memory device.

19. The memory device of claim 10, wherein each set of latency values of the plurality of sets of latency values includes a plurality of latency values that each correspond to a clock ratio from a plurality of clock ratios of the memory device.

20. The memory device of claim 10, wherein the plurality of sets of latency values comprises a plurality of sets of read latency values.

21. The memory device of claim 10, wherein the plurality of sets of latency values comprises a plurality of sets of write latency values.

22. The memory device of claim 10, wherein the plurality of sets of latency values comprises a plurality of sets of write recovery times.

\* \* \* \* \*